United States Patent [19]

McCarthy

[11] Patent Number: 4,544,942

[45] Date of Patent: Oct. 1, 1985

[54] HEAT SINKS WITH STAKED SOLDERABLE STUDS

[75] Inventor: Alfred F. McCarthy, Belmount, N.H.

[73] Assignee: Aavid Engineering, Inc., Laconia, N.H.

[21] Appl. No.: 671,033

[22] Filed: Nov. 14, 1984

Related U.S. Application Data

[63] Continuation of Ser. No. 351,012, Feb. 22, 1982, abandoned.

[51] Int. Cl.[4] .............. H01L 23/34; H01L 23/40; H01L 23/36
[52] U.S. Cl. .................................. 357/81; 174/16 HS
[58] Field of Search ............... 357/81; 29/522, 509; 174/16 HS; 165/80 B, 80 D, 80 R

[56] References Cited

U.S. PATENT DOCUMENTS

| | | | |
|---|---|---|---|
| 3,771,480 | 11/1973 | Johnson | 29/509 |
| 4,054,901 | 10/1977 | Edwards et al. | 357/81 |
| 4,388,967 | 6/1983 | Breese | 357/81 |

FOREIGN PATENT DOCUMENTS 918090  9/1954  Fed. Rep. of Germany ........ 29/522

OTHER PUBLICATIONS

"IERC Transister Heat Dissipator"-Electronic Design-Jan. 4, 1961, p. 114.
IERC Technical Bulletin-"Vertical Mount Dissipators for Plastic Power Semiconductors Save Valuable Board Space", Bulletin 184.

Primary Examiner—William D. Larkins
Assistant Examiner—Sheila V. Clark
Attorney, Agent, or Firm—James E. Mrose

[57] ABSTRACT

Heat sinks of the type which are fitted onto electronic solid-state devices to maintain acceptable thermal equilibrium conditions are provided with solderable sheet-metal appendages or studs staked onto their relatively cooler portions by way of punching which deforms and flows the heat-sink material into and through shaped openings so as to create sound mechanical interlocking. The studs are oriented for projection through a printed-circuit board, along with leads from the associated electronic device, for wave-soldering into rigidly-secured relation to the board.

2 Claims, 8 Drawing Figures

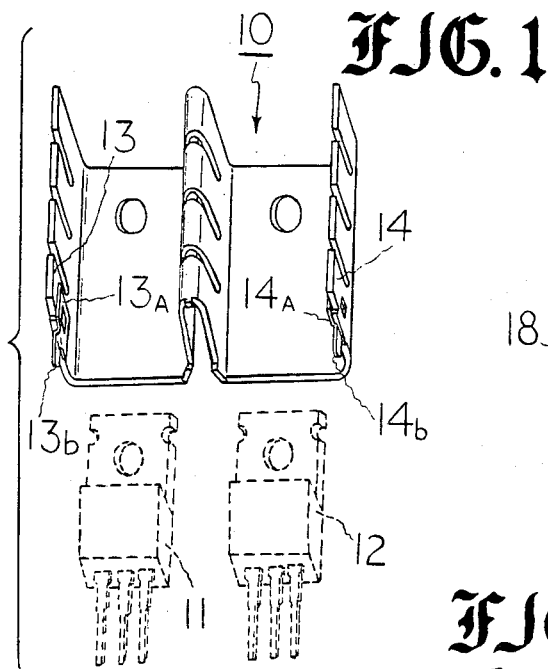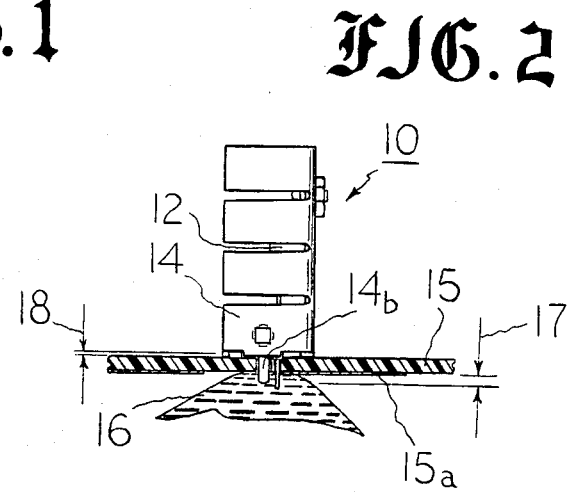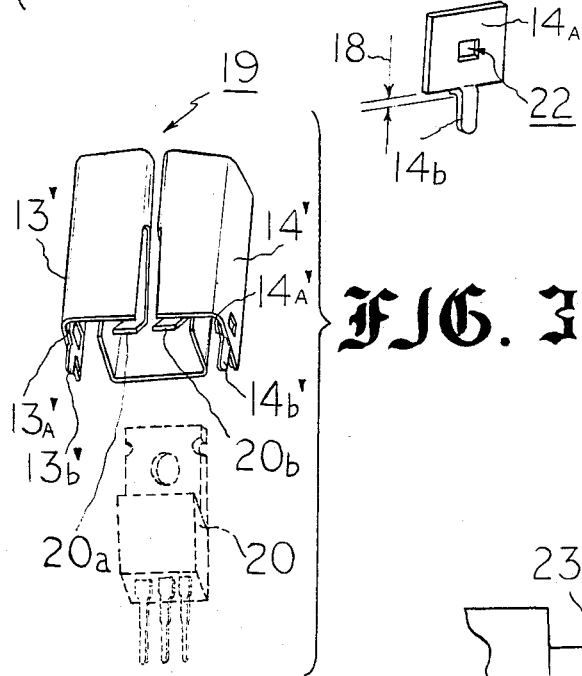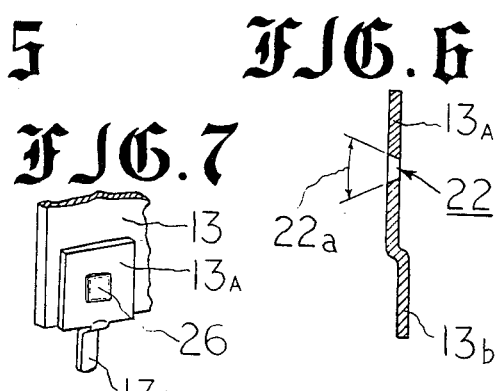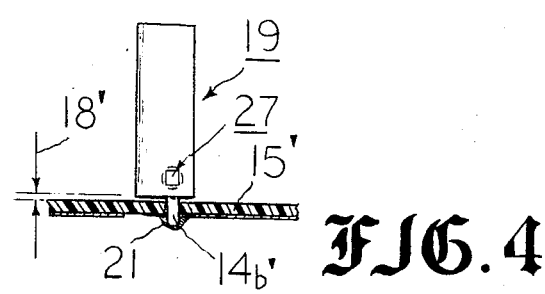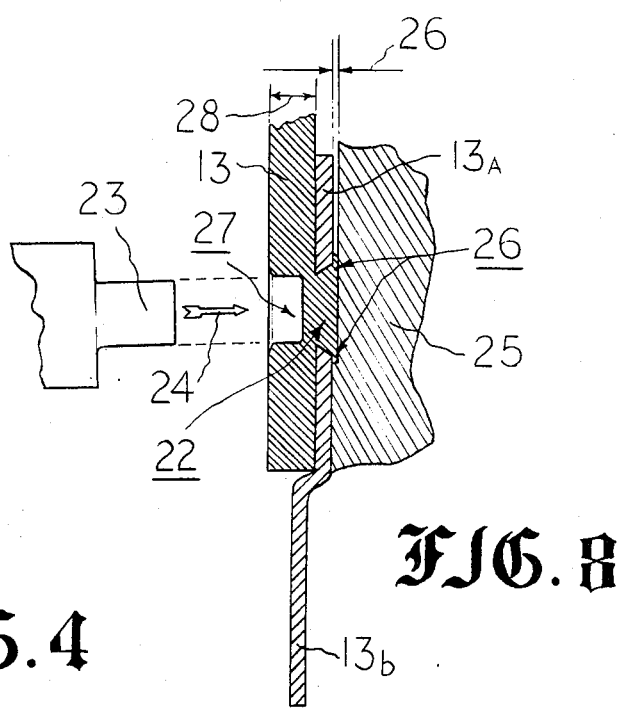

HEAT SINKS WITH STAKED SOLDERABLE STUDS

This is a continuation of co-pending application Ser. No. 351,012 filed on Feb. 22, 1982, now abandoned.

BACKGROUND OF THE INVENTION

The present invention relates to improvements in the fastening of heat sinks and associated electronic components with printed circuit boards, and, in one particular aspect, to unique and advantageous composite stamped-metal heat sinks soundly integrated with staked-on flat sheet-metal tabs to which solder will adhere readily and which are disposed to project through printed-circuit-board openings for convenient soldered locking in place when wave-soldering is performed.

Electronic semiconductor devices and circuit modules have power-handling limitations which are largely determined by their abilities to expel and avoid build-up of internally-generated heat. Such capabilities can be significantly extended and enlarged with the aid of finned metal extrusions or stampings which will conduct and radiate heat away from thermally-vulnerable regions, thereby upgrading low-cost devices into more demanding service than their uncooled ratings would otherwise allow. In most modern applications, the heat sinks cooperate with devices or modules disposed on or as part of printed circuitry, wherein a relatively sturdy insulating "board" serves as a mounting base and has networks of conductive foil-like connection paths on its surfaces. Preferably, the heat sinks required in such applications should be adaptable to inexpensive and labor-saving installation on the boards, and should be reliably connectable mechanically and electrically with the board and its conductors.

It has been a well-known practice to spring-clip miniature heat sinks onto small semiconductor devices (U.S. Pat. Nos. 3,572,428 and 4,012,769) and such devices have been soldered into place, via their electrical leads, on printed circuit boards, with their heat sinks clipped on top (U.S. Pat. No. 3,247,896). Further, a tab from such a heat sink has been utilized to make a separate soldered connection with the board, and to promote thermal and electrical contacting (U.S. Pat. No. 3,222,580). It has also been known to utilize solderable threaded studs and spacers which will allow for wave-soldered connections of heat sinks to printed circuit boards, as described in my copending joint U.S. Pat. No. 4,321,423, with Philip A. Johnson, for "Heat Sink Fastenings" Heat sinks with mounting tabs are also depicted in U.S. Pat. Nos. Des. 260,388 and Des. 260,761.

SUMMARY OF THE INVENTION

The present invention is aimed at providing heat sinks which offer improvements in respect of the economy, ease and simplicity with which normally non-solderable stampings are rendered mountable on and connectable with printed-circuit boards by way of the usual wave-soldering through which such boards are processed. In one preferred embodiment, a stamped sheet-metal heat sink, of a material such as aluminum which does not lend itself to wetting by conventional soldering, is fitted with a pair of relatively small and substantially flat sheet-metal studs of material to whose surfaces solder will readily adhere. Each stud includes an elongated thin tab integral with and depending from a larger-area portion through which there is a small pre-formed rectangular aperture. The larger-area portions are in abutting relation to outer cooling-fin members of the heat sink, near what are lower edges of the heat sink in its mounted relation to a printed circuit board, and the apertures are outwardly flared in direction away from the abutting heat-sink surfaces. Tightly-locked fastening of the studs to the heat sink is maintained by staking which results from punching the heat-sink material and cold-flowing some of it through and beyond the aperture, preferably until it encounters and is spread laterally by a back-up fixture used in the punching operation. The depending tabs are long enough to project through an associated printed circuit board, such that wave-soldering along its lower surfaces will leave small masses of solder at their ends and thereby securely fasten and hold the heat sink in its intended position.

Accordingly, it is one of the objects of this invention to provide novel and improved heat sinks having staked-on solderable studs which are readily and securely locked in place.

A further object is to provide unique and advantageous assemblages of heat sinks and solderable mountings for same which are shaped and staked to assure mechanical integrity without involving auxiliary fasteners.

BRIEF DESCRIPTION OF THE DRAWINGS

Although the aspects of this invention which are considered to be novel are expressed in the appended claims, further details as to preferred practices and as to further objects and features thereof may be most readily comprehended through reference to the following detailed description when taken in connection with the accompanying drawings, wherein:

FIG. 1 is a perspective view of a dual finned heat sink equipped with solderable sheet-metal studs according to the present teachings, together with broken-line illustrations of a pair of electronic semiconductors with which it may be mated to dissipate their heat;

FIG. 2 is a partly sectioned side view of a printed circuit board on which the heat-sink assemblage of FIG. 1 is mounted, shown as the board undergoes wave-soldering;

FIG. 3 is a pictorial view of winged form of heat sink equipped with the solderable sheet-metal studs, together with a broken-line illustration of a single power package with which it may be mated for heat-dissipation purposes;

FIG. 4 is a partly sectioned side view of a printed circuit board to which the heat sink of FIG. 3 has been secured by soldering of its staked studs;

FIG. 5 portrays my improved sheet-metal solderable stud, such as that incorporated into the heat sinks of FIGS. 1–4, on an enlarged scale;

FIG. 6 provides a longitudinal cross-section of the stud of FIG. 5, on a still further enlarged scale;

FIG. 7 represents a staked assembly of the stud of FIG. 5 with a fragment of a heat sink; and FIG. 8 is a cross-sectioned enlargement of a staked assembly such as that of FIG. 7, together with punch and fixture members which drive and guide the cold flow of heat-sink material through and into locking relationship with an apertured sheet-metal stud.

DETAILED DESCRIPTION OF THE PREFERRED EMBODIMENTS

Having reference to the drawings, wherein like reference characters designate identical or corresponding parts throughout the different views, and more particularly to FIG. 1 thereof, one expression of an improved dual heat-sink unit, 10, is shown in closely-spaced relation to a pair of electronic semiconductor devices 11 and 12. That arrangement is generally like the dual heat sink shown in my U.S. Pat. No. Des. 269,084, date May 24, 1983 for "Dual Heat Sink for Electronic Devices", but in this instance there is improvement in that outer and lower sheet-like fin elements 13 and 14 are staked securely with somewhat thinner abutting sheet-metal studs 13A and 14A having small integral tab portions 13b and 14b, the latter preferably have a slight offset, as shown, which aids in maintaining a desirable spacing and preserving a locked relationship of heat sink and stud. Studs 13A and 14A are disposed along inside surfaces of the fin elements, although they are thin and thus do not interfere with assembly of the heat sink and semiconductor devices, or with circulation of ambient air for the intended cooling purposes of unit 10. In FIG. 2, the same unit is viewed toward its right side, in an assembled mated relationship with its semiconductor devices, such as 12, and with the tab portions, such as 14b, projecting fully through an accommodating opening in a printed circuit board 15. Leads from the semiconductor device likewise project through the board, where they are similarly disposed for "wetting" and bonding to foil cladding connections, such as 15a, upon being exposed to a molten solder wave 16 as the board and components mounted on it is moved relative to the wave. The tab portions project below the cooperating board for a distance 17 sufficient to allow and promote the collection of a mass of solder adequate to anchor the tab portion in place on the board, along with the heat sink 10. In addition, if it is appropriate to the circuitry involved, the tab portions may in the same manner be electrically solder-connected to the foil cladding, for grounding or other purposes. The studs and their tab portions are either of material, or plated or "tinned" with material, which is readily "wettable" by solder conventionally used in circuitboard processing. By way of distinction, the heat sinks proper, to which they are affixed, are preferably of other material, such as aluminum or anodized aluminum or other painted or oxidized material, which does not lend itself to wetting by solder; for such reason, other mounting arrangements for heat sinks have commonly included mechanical fasteners, which are both troublesome and labor-intensive. Because the tab portions are offset so as to cross under the lower edges of the fins 13 and 14, they can help to insure that there will be at least a small spacing 18 between those lower edges and the top of the board, thereby avoiding interference between the heat sink and such circuit-path cladding as may appear along top surfaces of the board.

The winged heat sink 19 appearing in FIG. 3 is designed for use with a single semiconductor power device, represented by linework 20, and is of a construction described more fully in my U.S. Pat. No. 4,215,361. Device 20 is intended to be spring-restrained within the heat sink by its resilient fingers 20a and 20b, and the gull-wing type heat-radiating fins are coolest at their outer extremities 13' and 14' where the sheet-metal mounting studs 13A' and 14A' are staked, as in the case of their counterparts of like numbering in FIGS. 1 and 2. As shown in FIG. 4, unit 19 is assembled with a circuit board 15', and a small solidified mass of solder 21 envelops and securely anchors the lower end of its depending tab portion 14b' after wave-soldering or the like has been completed. Useful top spacing 18' is realized, as in the case of unit 10. In the somewhat enlarged views of the sheetmetal studs 14A and 13A provided in FIGS. 5-7, the staked locking features are more clearly illustrated, and it will of course be understood that the same considerations apply as to the unit 19 solderable studs. The studs are of uniform-thickness stamped sheet metal, and their broader-area portions are pierced with an aperture 22 which is non-symmetrical in two respects: first, it is non-circular, and preferably of the square outline shown, so that relative rotation is opposed between the studs and the associated heat sink fins or wings; and, second, it is outwardly-flaring, from the part nearest abutment with the heat-sink surfaces. Flare angle 22a in FIG. 6 characterizes the latter asymmetry, and it is preferably in both directions, for the purpose of augmenting the rigid hold of the staking which results as metal of the heat sink is cold-flowed into and through the aperture.

The further enlargement in FIG. 8 characterizes the staking by way of cold flow of metal of the heat sink limb 13 through the flared stud aperture 22. To that end, a suitable punch member 23 is driven in direction of arrow 24 against the abutted heat-sink limb 13 and stud 13A, both of which are at the time sturdily backed by a fixture member 25 which resists their movement except in respect of the desired cold flow of metal. Fixture member 25 is recessed very slightly (example: 0.005 inch, dimension 26) to allow some of the cold-flowed or punch-extruded metal of the heat sink to spread laterally beyond the edges of aperture 22 and form a peened-over type "head" 26 giving the integral fastening a rivet-like quality. The resulting surface indentation 27 in the heat sink represents displaced material, and does not involve undue weakening provided the heat-sink material thickness 28 is sufficiently in excess of the thickness of the sheet-metal stud. Further, the material of the sheet-metal studs should be no less ductile than that of the heat sink, and preferably harder and less readily deformable.

It should be understood that the specific embodiments and practices shown and described herein have been presented by way of disclosure, rather than limitation, and that various modifications, combinations and substitutions may be effected by those skilled in the art without departure in spirit or scope from this invention in its broader aspects and as set forth in the appended claims.

What I claim as new and desire to secure by Letters Patent of the United States is:

1. Heat sink apparatus fastenable with a packaged electronic device for wave-soldered mounting on a printed-circuit board, comprising a metal heat sink having cooling portions remote from a portion adapted to be mated with a packaged electronic device, and relatively thin sheet-metal mounting studs each having a substantially flat and relatively broad-area portion abutted and staked with surfaces of said cooling portions which face inwardly of the exterior of said cooling portions and each having an elongated integral solderable tab portion depending therefrom in position to project through accomodating openings in a printed-circuit board and to bond with solder which locks the tab portion with the board and thereby holds the heat sink in place atop the board, said mounting studs each having a doubly non-symmetrical aperture therethrough into which material of an abutted cooling portion of said heat sink has been cold flowed by punching, said aperture being oriented substantially centrally of said broad-area portion and having a polygonal outline imparting an angular non-symmetry to it about its center and being non-symmetrical in the transverse direction by being flared outwardly in said transverse direction away from the side of said broad-area portion which abuts said heat sink, and said tab portion of each of said studs being laterally displaced slightly from said broad-area portion to form a bend at the lower edges thereof disposed for underlying contact with lower edges of said cooling portions of said heat sink and otherwise projecting downwardly substantially parallel with said broad-area portion, said bend augmenting angular locking effects and serving as a spacer between said lower edges of said cooling portions and the top of the printed-circuit board.

2. Heat sink apparatus as set forth in claim 1 wherein the material of said cooling portions of said heat sink is thicker and softer than that of said mounting studs and is not readily wettable by solder, wherein surfaces of the tab portions of said studs are readily wettable by molten solder and tend to retain masses of solder thereon, wherein material of said heat sink which has been cold-flowed through the apertures is peened over surfaces of said sheet-metal studs as the result of punching against exterior surfaces of said cooling portions which are aligned with said apertures in underlying sheet-metal studs which are in turn rigidly backed by a fixture member having a shallow recess allowing the softer material of said heat sink to cold-flow through said apertures and spread laterally beyond edges of said apertures to form rivet-like enlarged heads, wherein said sheet-metal studs and said apertures are of substantially rectangular outline, and wherein said apertures are flared outwardly along all edges of said rectangular outline thereof in direction away from the sides of the studs which abut with said cooled portions of said heat sink.

* * * * *